United States Patent
Yanagisawa

(10) Patent No.: US 7,466,145 B2
(45) Date of Patent: Dec. 16, 2008

(54) VOLTAGE MEASURING APPARATUS AND POWER MEASURING APPARATUS

(75) Inventor: Koichi Yanagisawa, Ueda (JP)

(73) Assignee: Hioki Denki Kabushiki Kaisha, Nagano (JP)

( * ) Notice: Subject to any disclaimer, the term of this patent is extended or adjusted under 35 U.S.C. 154(b) by 21 days.

(21) Appl. No.: 11/539,891

(22) Filed: Oct. 10, 2006

(65) Prior Publication Data

US 2007/0108992 A1   May 17, 2007

(30) Foreign Application Priority Data

Oct. 12, 2005   (JP)   ............... 2005-297171

(51) Int. Cl.
  *G01R 27/26*   (2006.01)
  *G01R 29/12*   (2006.01)
(52) U.S. Cl. .................. 324/658; 324/457; 324/686; 324/690
(58) Field of Classification Search ............. 324/457, 324/658, 686, 690
  See application file for complete search history.

(56) References Cited

U.S. PATENT DOCUMENTS

| 4,489,278 | A  | * | 12/1984 | Sawazaki ........... | 324/457 |
| 4,614,908 | A  | * | 9/1986  | Daniele et al. ....... | 324/457 |
| 6,407,557 | B1 | * | 6/2002  | Coudray et al. ...... | 324/658 |
| 6,756,849 | B2 | * | 6/2004  | Dupuis et al. ....... | 330/279 |
| 7,015,705 | B2 | * | 3/2006  | Inaba et al. ......... | 324/658 |
| 7,119,550 | B2 | * | 10/2006 | Kitano et al. ........ | 324/658 |
| 2006/0267558 | A1 | * | 11/2006 | Petz et al. .......... | 320/166 |

FOREIGN PATENT DOCUMENTS

| JP | 4-305171  | 10/1992 |
| JP | 6-242166  | 9/1994  |
| JP | 6-308179  | 11/1994 |
| JP | 7-244103  | 9/1995  |
| JP | 8-181038  | 7/1996  |
| JP | 8-271562  | 10/1996 |
| JP | 9-153436  | 6/1997  |

OTHER PUBLICATIONS

English language abstract of JP 4-305171.
English language abstract of JP 7-244103.
English language abstract of JP 8-181038.
English language abstract of JP 9-153436.
English language abstract of JP 6-308179.
English language abstract of JP 6-242166.
English language abstract of JP 8-271562.

* cited by examiner

*Primary Examiner*—Timothy J Dole
(74) *Attorney, Agent, or Firm*—Greenblum & Bernstein, P.L.C.

(57) ABSTRACT

A voltage measuring apparatus measures the voltage of a measured object and includes a detection electrode capable of being disposed facing the measured object, a variable capacitance circuit that is connected between the detection electrode and a reference potential and whose electrostatic capacitance can be changed, a voltage generating circuits that generates the reference potential, and a control unit. The control unit causes the voltage generating circuit to change the reference potential while the electrostatic capacitance of the variable capacitance circuit is being changed. A power measuring apparatus includes the voltage measuring apparatus and a current measuring apparatus that measures current flowing in the measured object, and measures power based on the current measured by the current measuring apparatus and the voltage measured by the voltage measuring apparatus.

10 Claims, 6 Drawing Sheets

VOLTAGE MEASURING APPARATUS AND POWER MEASURING APPARATUS

BACKGROUND OF THE INVENTION

1. Field of the Invention

The present invention relates to a voltage measuring apparatus that can measure the voltage of a measured object without contacting the object, and to a power measuring apparatus that uses such voltage measuring apparatus.

2. Description of the Related Art

As examples of this type of voltage measuring apparatus, the voltage measuring apparatuses disclosed by Japanese Laid-Open Patent Publication Nos. H04-305171 and H07-244103 are known.

Out of such voltage measuring apparatuses, according to the conventional technology disclosed by Japanese Laid-Open Patent Publication No. H04-305171, a voltage measuring apparatus (distance-compensating potentiometer) used to measure the charge density of both surfaces of a measured object (a charged body) includes a probe unit, in which a detection electrode and a vibrating body are incorporated, an oscillator, a preamp, an amplifier, a synchronous detector, an integrator, a high-voltage generator, and an impedance matching circuit. With this voltage measuring apparatus, the detection electrode is vibrated using the vibrating body and disposed facing the measured object. When doing so, since the electrostatic capacitance formed between the detection electrode and the measured object changes and therefore the electric field strength between the measured object and the detection electrode changes, an AC voltage corresponding to the electric field strength between the measured object and the detection electrode is generated across the detection electrode. The high-voltage generator generates a DC voltage corresponding to this AC voltage and feeds the DC voltage back to the voltage of the probe unit. When doing so, the electric field strength between the measured object and the detection electrode becomes zero when the voltage of the probe unit matches the voltage of the charged body. Accordingly, by measuring the DC voltage fed back from the high-voltage generator to the probe unit when the electric Field strength between the measured object and the detection electrode becomes zero, that is, when the AC voltage generated in the detection electrode reaches zero volts, the voltage of the measured body is measured.

On the other hand, with the conventional technology disclosed by Japanese Laid-Open Patent Publication No. H07-244103, in the disclosed voltage measuring apparatus (a distance-compensating surface potentiometer), electric charge that is proportional to the potential of the measured object (the "sample") and is proportional to the electrostatic capacitance between the detection electrode (the "fixed electrode") and the measured object is generated at the surface of the detection electrode by electric flux lines, out of the electric flux lines emitted from the surface of the measured object, which pass through an input hole and reach the detection electrode. A conductive sector is mechanically moved so as to repeatedly shield and then release the electric flux lines that pass through the input hole to reach the detection electrode. By doing so, charge is repeatedly generated at and removed from the detection electrode, a current that is proportional to the rate of change in the charge flows to a load resistance, and an AC voltage is generated across the load resistance. Although the voltage measuring apparatus disclosed by Japanese Laid-Open Patent Publication No. H07-244103 differs to the voltage measuring apparatus disclosed by Japanese Laid-Open Patent Publication No. H04-305171 described above in the construction for generating the AC voltage, the other parts of the construction are fundamentally the same as in the voltage measuring apparatus disclosed by Japanese Laid-Open Patent Publication No. H04-305171. By reducing the potential difference between the probe case (or the equivalent to a case for the probe unit) and the measured object based on the AC voltage generated across the load resistance, the potential of the measured object is measured in the same way as by the voltage measuring apparatus disclosed by Japanese Laid-Open Patent Publication No. H04-305171.

SUMMARY OF THE INVENTION

By investigating the voltage measuring apparatuses described above, the present inventors discovered the following problems. That is, in the voltage measuring apparatus disclosed by Japanese Laid-Open Patent Publication No. H04-305171, to form electrostatic capacitance between the apparatus and the measured object, the detection electrode is disposed inside the probe unit so as to be attached to the vibrating body and exposed to the outside from a hole formed in the probe unit. On the other hand, in the voltage measuring apparatus disclosed by Japanese Laid-Open Patent Publication No. H07-244103, the conductive sector that shields and releases the electric flux lines inputted from the input hole is disposed inside the probe case so as to be exposed from the input hole. That is, both voltage measuring apparatuses are constructed with a moving member such as the detection electrode or the conductive sector exposed from a hole formed in the probe unit or the like. Accordingly, with both voltage measuring apparatuses, when foreign matter is accidentally inserted into the probe unit via the hole, there is the risk of damage to the detection electrode or the conductive sector due to the foreign matter striking the detection electrode or the conductive sector that moves at high speed, resulting in the problem of lower reliability.

The present invention was conceived to solve the problem described above, and it is a principal object of the present invention to provide a highly reliable voltage measuring apparatus. It is another principal object of the present invention to provide a highly reliable power measuring apparatus.

To achieve the stated object, a voltage measuring apparatus according to the present invention measures the voltage of a measured object and includes: a detection electrode capable of being disposed facing the measured object; a variable capacitance circuit that is connected between the detection electrode and a reference potential and whose electrostatic capacitance can be changed; a voltage generating circuit that generates the reference potential; and a control unit, wherein the control unit causes the voltage generating circuit to change the voltage of the reference potential while the electrostatic capacitance of the variable capacitance circuit is being changed.

In this voltage measuring apparatus, in a state where a constant (fixed) electrostatic capacitance is formed between the measured object and the detection electrode by disposing the detection electrode facing the measured object, while the electrostatic capacitance of the variable capacitance circuit is being changed, the control unit causes the voltage generating circuit to change the voltage of the reference potential. This means that by detecting the current generated in the variable capacitance circuit or the voltage across both ends of the variable capacitance circuit while the electrostatic capacitance is being changed, it is possible to measure the reference potential at a point when the current or the voltage across both ends has become a predetermined value or below as the voltage of the measured object. With this voltage measuring apparatus, since it is possible to measure the voltage of the measured object in a state where for example the detection electrode is disposed on the surface of a case and the variable capacitance circuit is disposed inside the case, it is no longer necessary to provide a hole in the case for disposing the variable capacitance circuit directly facing the measured object. As a result, it is possible to reliably avoid having foreign matter erroneously inserted into the case via the hole and to avoid damage to components inside the apparatus due to such insertion, and therefore the reliability of the apparatus can be sufficiently improved.

The variable capacitance circuit may include first and second capacitance circuits that are each constructed by connecting a first element, which has a P-type semiconductor and an N-type semiconductor that are joined together, and a DC power supply, which applies a reverse bias to the first element, in series, the first and second capacitance circuits being disposed in series between the detection electrode and the reference potential so that respective directions of the first elements become reverse to each other, and the voltage measuring apparatus may further comprise a driving circuit that drives the variable capacitance circuit by applying driving signals with inverted phases to the first and second capacitance circuits, respectively.

With this construction, since voltage components of the driving signals generated by the respective capacitance circuits disposed in series cancel each other out, it is possible to avoid generating voltage components of the driving signals between the detection electrode end and the reference potential end of the variable capacitance circuit. Since it is possible to eradicate the effects of the driving signals on the current generated in the variable capacitance circuit or the voltage across both ends of the variable capacitance circuit when the electrostatic capacitance is being changed, the current or the voltage across both ends can be detected more accurately. In this way, according to this voltage measuring apparatus, it is possible to measure the voltage of the measured object more accurately.

Each of the first elements may be constructed of a diode formed of the P-type semiconductor and the N-type semiconductor.

With this construction, it is possible to construct the variable capacitance circuit easily and inexpensively.

The driving circuit may include first and second transformers whose primary windings are connected in parallel, a first capacitance element connected in series to a secondary winding of the first transformer, and a second capacitance element connected in series to a secondary winding of the second transformer, a series circuit composed of the secondary winding of the first transformer and the first capacitance element may be connected in parallel to the first capacitance circuit, and a series circuit composed of the secondary winding of the second transformer and the second capacitance element may be connected in parallel to the second capacitance circuit.

With this construction, by merely applying one signal to the primary windings of the transformers, it is possible to generate two driving signals that have respectively inverted phases and to apply the driving signals to the capacitance circuits. Also, according to the DC circuit breaker function of the capacitance elements, it is possible to reliably avoid having a DC current flow from the measured object to the reference potential via the variable capacitance circuit.

The first capacitance element and the second capacitance element may be constructed of capacitors.

With this construction, the driving circuit can be constructed inexpensively.

In the voltage measuring apparatus according to the present invention, while the electrostatic capacitance is being changed, the control unit may cause the voltage generating circuit to change the voltage of the reference potential so that one of the current flowing between the detection electrode and the reference potential via the variable capacitance circuit and the voltage generated between a detection electrode end and a reference potential end of the variable capacitance circuit falls.

According to this voltage measuring apparatus, while the electrostatic capacitance is being changed, the voltage of the measured object is measured by having the control unit cause the voltage generating circuit to change the voltage of the reference potential so that one of the current flowing between the detection electrode and the reference potential via the variable capacitance circuit and the voltage generated between a detection electrode end and a reference potential end of the variable capacitance circuit falls, or in other words, by having the control unit carry out feedback control of the voltage generating circuit based on the current or the voltage described above. This means that the voltage of the measured object can be measured with high precision compared for example to a construction where the electrostatic capacitance of a variable capacitance circuit is statically changed to a known electrostatic capacitance the voltage applied to the variable capacitance circuit is detected for each electrostatic capacitance, a number of equations that is equal to the number of unknowns including the voltage of the measured object and the electrostatic capacitance between the measured object and the detection electrode are produced, and the voltage of the measured object is found by calculating the unknowns from such equations.

The voltage measuring apparatus may further include an impedance element disposed in series with the variable capacitance circuit between the detection electrode and the reference potential, and the control unit may cause the voltage generating circuit to change the voltage of the reference potential so that the voltage generated across the impedance element when the current flows through the impedance element falls.

With this construction, by chancing the impedance value of the impedance element, it is possible to freely change the voltage generated across the impedance element when the current flows through the impedance element. This means that the voltage of the measured object can be measured across a wide voltage range from a low voltage to a high voltage.

The voltage measuring apparatus according to the present invention may further include a resonance circuit disposed in series with the variable capacitance circuit between the detection electrode and the reference potential, and the control unit may cause the voltage generating circuit to change the voltage of the reference potential so that the voltage generated across the resonance circuit when the current flows through the resonance circuit fails.

With this construction, by changing the impedance value of the resonance circuit when the resonance circuit resonates, it is possible to freely change the voltage generated across the resonance circuit when the current flows. This means that the voltage of the measured object can be measured across a wide voltage range from a low voltage to a high voltage. It is also possible to detect the current flowing in the resonance circuit as a larger voltage by changing the electrostatic capacitance of the variable capacitance circuit at the resonance frequency of the resonance circuit. As a result, since the voltage measuring apparatus can be made more resistant to noise, the voltage of the measured object can be measured with reduced error.

The control unit may include an A/D conversion circuit that receives an input of a detection signal whose voltage changes in accordance with a value of the current or a value of the voltage generated between the detection electrode end and the reference potential end and converts the detection signal to digital data, and the control unit may cause the voltage generating circuit to change the voltage of the reference potential based on the digital data so that the voltage of the detection signal falls.

With this construction, the control unit can be easily constructed using a digital circuit that uses a CPU or a DSP (Digital Signal Processor).

A power measuring apparatus according to the present invention includes: a current measuring apparatus that measures current flowing in a measured object; and any of the voltage measuring apparatuses described above that measures the voltage of the measured object, wherein the power measuring apparatus measures power based on the current measured by the current measuring apparatus and the voltage measured by the voltage measuring apparatus.

According to this power measuring apparatus, by including a voltage measuring apparatus that is highly reliable, it is possible to sufficiently improve the reliability of the power measuring apparatus itself.

It should be noted that the disclosure of the present invention relates to a content of Japanese Patent Application 2005-297171 that was filed on 12 Oct. 2005 and the entire content of which is herein incorporated by reference.

BRIEF DESCRIPTION OF THE DRAWINGS

These and other objects and features of the present invention will be explained in more detail below with reference to the attached drawings, wherein.

DESCRIPTION OF THE PREFERRED EMBODIMENTS

Preferred embodiments of a voltage measuring apparatus and a power measuring apparatus according to the present invention will now be described with reference to the attached drawings.

First, a voltage measuring apparatus 1 according to the present invention will be described with reference to the drawings.

Figure 1:
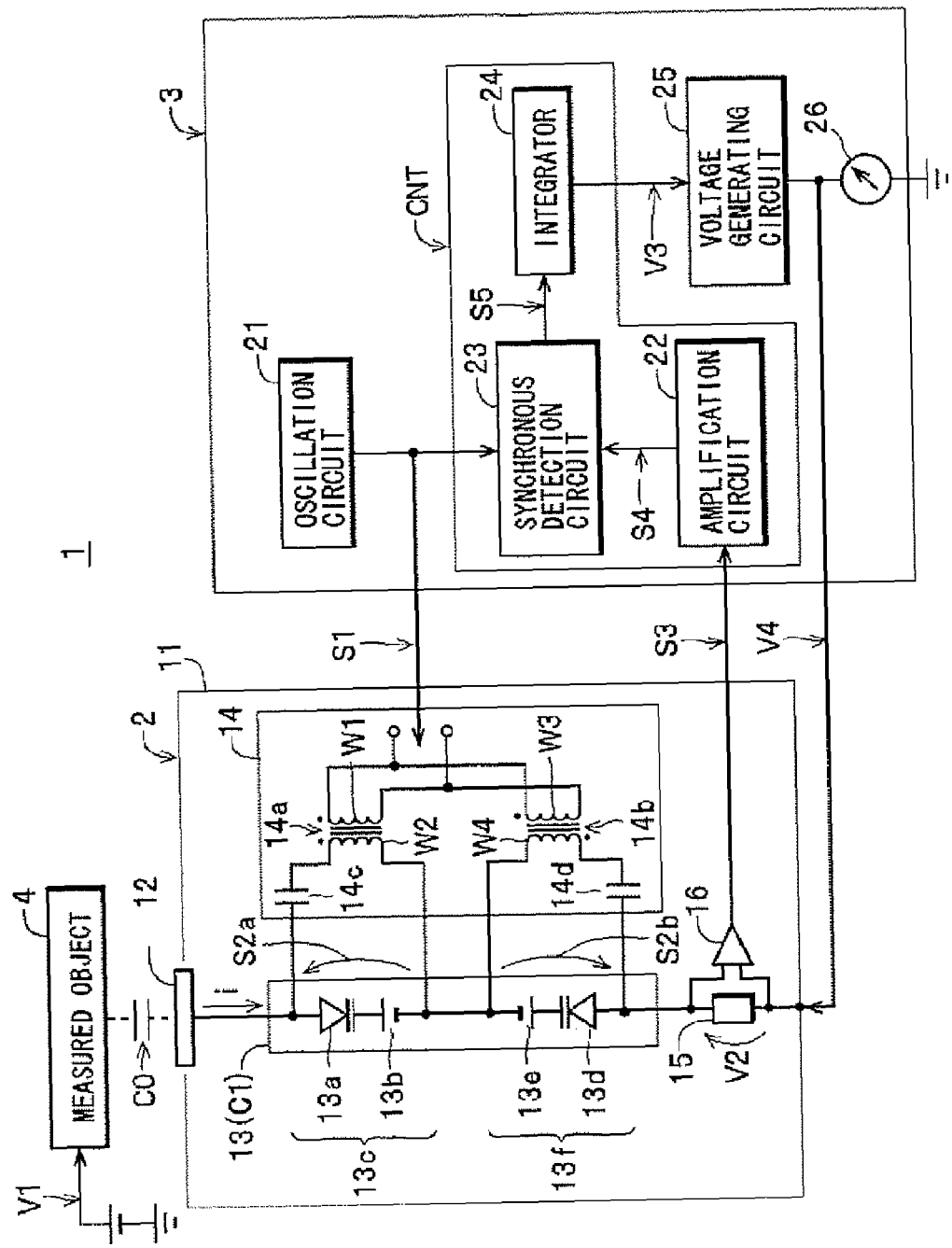
FIG. 1 is a block diagram of a voltage measuring apparatus.

As shown in FIG. 1, the voltage measuring apparatus 1 includes a probe unit 2 and a main unit 3 and is constructed so as to be capable of measuring a voltage V1 of a measured object 4 without contacting the measured object 4. Here, the expression "voltage V1" refers to a voltage relative to ground potential (a "reference potential").

As shown in FIG. 1, the probe unit 2 includes a case 11, a detection electrode 12, a variable capacitance circuit 13, a driving circuit 14, a current detector 15, and a preamp 16. The case 11 is constructed using a conductive material (for example, a metal material). The detection electrode 12 is formed in a flat-plate-like shaper for example, and is fixed to the case 11 so that one surface thereof is exposed to an outer surface of the case 11 and the other surface thereof is exposed to the inside of the case 11. As one example, the detection electrode 12 is attached to a hole (not shown) provided in the case 11 so as to cover the hole and is electrically insulated from the case 11. Also, in the present embodiment, as one example, the surface of the case 11 is covered with an insulating film formed of a resin material or the like. The detection electrode 12 may be covered with the insulating film or may be exposed from the insulating film.

The variable capacitance circuit 13 is equipped with a function for continuously changing the electrostatic capacitance C1 thereof when driving signals S2, described later, are inputted from the driving circuit 14, and is connected (disposed) between the detection electrode 12 and a part (in the present embodiment, the case 11) used as the reference potential. In the present embodiment, as one example, as shown in FIG. 1, the variable capacitance circuit 13 includes a first capacitance circuit 13c, where a first element 13a, in which a P-type semiconductor and an N-type semiconductor are joined together, and a DC current supply 13b, which applies a reverse bias to the first element 13a, are connected in series, and a second capacitance circuit 13f, where a first element 13d, in which a P-type semiconductor and an N-type semiconductor are joined together, and a DC current supply 13e, which applies a reverse bias to the first element 13d, are connected in series. The first and second capacitance circuits 13c and 13f are disposed between the detection electrode 12 and the case 11 in series so that respective directions of the first elements 13a, 13d become reverse to each other. In the present embodiment, as one example, the first elements 13a, 13d are each constructed of a single diode (referred to hereinafter as the diodes 13a, 13d). In this case, components with the same specifications should preferably be used as the diodes 13a, 13d and the DC current supplies 13b and 13e. In the present embodiment, variable-capacitance diodes (also referred to as varicaps or varactor diodes) are used as the diodes 13a and 13d. A variable-capacitance diode makes use of the change in electrostatic capacitance (junction capacitance) caused by a change in the thickness of the depletion layer at the PFN junction of the diode when a voltage is applied in the reverse direction, and boosts this change in electrostatic capacitance. With a standard diode (silicon diode) constructed of a PN junction, the change in electrostatic capacitance (junction capacitance) described above also occurs, but such change is smaller compared to a variable-capacitance diode. Accordingly, normal diodes can also be used as the diodes 13a, 13d. As one example, although the first capacitance circuit 13c is disposed on the detection electrode 12 side and -he second capacitance circuit 13f is disposed on the case 11 s-de in the example described above, the positions of the capacitance circuits 13c, 13f may be reversed. In the capacitance circuit 13c, the positional relationship between the diode 13a and the DC current supply 13b may be reversed and in the capacitance circuit 13f, the positional relationship between the diode 13d and the DC current supply 13e may be reversed. In the variable capacitance circuit 13 constructed in this way, the electrostatic capacitance C1 is changed continuously (cyclically) with the cycle of the driving signals S2 in synchronization with the driving signals S2. That is, the capacitance modulation frequency of the variable capacitance circuit 13 of the present embodiment matches the frequency of the driving signals S2. The variable capacitance circuit 13 is disposed inside the case 11 and is not exposed to the outside of the case 11.

Note that the variable capacitance circuit is not limited to a construction that uses diodes or the like as described above and it is possible to use the construction disclosed by Japanese Laid-Open Patent Publication No. H04-305171 described above, that is, a construction (not shown) including a detection electrode and a vibrating body. For a variable capacitance circuit (variable capacitance mechanism) of this construction, another detection electrode (i.e., a separate electrode to the detection electrode 12) is moved toward and away from the detection electrode 12 by the vibrating body, thereby changing the electrostatic capacitance C1 of the variable capacitance circuit, that is, the electrostatic capacitance C1 between the other detection electrode and the detection electrode 12. It is also possible to use the construction disclosed by Japanese Laid-Open Patent Publication No. H07-244103 described above, that is, a construction (not shown) including a conductive sector and another detection electrode (i.e., a separate electrode to the detection electrode 12). For a variable capacitance circuit (variable capacitance mechanism) of this construction, the other detection electrode is disposed facing the detection electrode 12 and the conductive sector is disposed between both detection electrodes. By having the conductive sector repeatedly shield and release the electric flux lines that reach the other detection electrode from the detection electrode 12, the electrostatic capacitance C1, that is, the electrostatic capacitance C1 between the other detection electrode and the detection electrode 12 is changed. In addition, as the variable capacitance circuit, it is possible to use the variable capacitors disclosed by Japanese Laid-Open Patent Publication Nos. H08-181038 and H09-153436, that is, variable capacitors (not shown) where the electrostatic capacitance C1 is changed by changing the distance between a pair of electrodes disposed close to one another by causing elastic deformation of at least one of the electrodes.

As one example, the driving circuit 14 is constructed using transformers and insulating electronic components such as optically coupled isolators (for example, photocouplers). The driving circuit 14 converts a driving signal S1 inputted from the main unit 3 to a pair of driving signals S2a, S2b (referred to collectively as the "driving signals S2" when no distinction is required) that are electrically insulated from the driving signal S1, have the same frequency as the driving signal S1, and have the same amplitude but respectively inverted phases and outputs (applies) the driving signals S2 to the variable capacitance circuit 13. More specifically, in the present embodiment, as shown in FIG. 1, the driving circuit 14 includes first and second transformers 14a, 14b (hereinafter also referred to as "transformers 14a, 14b") and first and second capacitance elements 14c, 14d (hereinafter also referred to as "capacitance elements 14c, 14d") that have the same constructions. The primary windings W1, W3 of the transformers 14a, 14b are connected in parallel. The transformers 14a, 14b are constructed so that when the driving signal S1 is inputted into the respective primary windings W1, W3, the driving signals S2a, S2b whose respective phases are inverted (i.e., whose polarities are inverted) are generated across the secondary windings W2, W4. As one example, the capacitance elements 14c, 14d are constructed of capacitors. The capacitance element 14c is connected in series to the secondary winding W2 of the transformer 14a and the capacitance element 14d is connected in series to the secondary winding W4 of the transformer 14b.

The series circuit composed of the capacitance element 14c and the secondary winding W2 of the transformer 14a is connected in parallel to the capacitance circuit 13c and applies the driving signal S2a to the capacitance circuit 13c. In the same way, the series circuit composed of the capacitance element 14d and the secondary winding W4 of the transformer 14b is connected in parallel to the capacitance circuit 13f and applies the driving signal S2b to the capacitance circuit 13f. Here, the driving signal S2a is applied to the diode 13a after being superimposed on the DC voltage outputted from the DC current supply 13b and in the same way, the driving signal S2b is applied to the diode 13d after being superimposed on the DC voltage (the same voltage as the DC voltage of the DC current supply 13b) outputted from the DC current supply 13e, with the amplitude of both driving signals S2 being set in advance so that the diodes 13a, 13d are continuously reverse biased by the DC voltage from the DC current supplies 13b, 13e. Note that although the capacitors 14c, 14d are disposed on the diode 13a, 13d sides of the capacitance circuits 13c, 13f in the series circuits of the present embodiment, the capacitors 14c, 14d may be disposed on the DC current supply 13b, 13e sides. The capacitors 14c, 14d prevent a DC circuit from being formed between the detection electrode 12 and the case 11 via the secondary windings W2, W4 of the transformers 14a, 14b.

The current detector 15 is a "voltage converting circuit" for the present invention, is constructed of a resistor, for example, and is connected between the variable capacitance circuit 13 and the case 11. By doing so, the current detector 15 is disposed between the detection electrode 12 and the case 11 so as to be connected in series to the variable capacitance circuit 13, detects the current i (physical value) flowing through the variable capacitance circuit 13 and generates a voltage V2 across the ends of the current detector 15 whose magnitude is proportional to the magnitude of the current i and whose polarity corresponds to the direction of the current i. The preamp 16 includes a pair of capacitors, not shown, that function as a DC circuit breaker, an amplification circuit such as an operational amplifier, not shown, and an insulating electronic component (a transformer and a photocoupler or the like), also not shown. In the present embodiment, the preamp 16 is constructed of a differential operational amplifier, for example, amplifies the voltage V2 inputted via the capacitors using the amplification circuit, converts the amplified voltage to a detection signal S3 that is electrically insulated from the amplification circuit by the insulating electronic component, and outputs the detection signal S3. Here, since the voltage V2 changes in proportion to the magnitude of the current i, the detection signal 53 generated by amplifying the voltage V2 changes in proportion to the magnitude of the current i. The driving circuit 14, the current detector 15, and the preamp 16 described above are disposed inside the case 11 together with the variable capacitance circuit 13.

As shown in FIG. 1, the main unit 3 includes an oscillation circuit 21, an amplification circuit 22, a synchronous detection circuit 23, an integrator 24, a voltage generating circuit 25, and a voltmeter 26. The oscillation circuit 21 generates the driving signal S1 that has a fixed frequency and outputs the driving signal S1 to the probe unit 2 and the synchronous detection circuit 23. In the present embodiment, the oscillation circuit 21 generates a sinusoidal signal as the driving signal S1. The amplification circuit 22 amplifies the detection signal S3 inputted from the probe unit 2 to a voltage level set in advance and outputs the amplified detection signal S3 as a detection signal S4. In the present embodiment, as described later, the capacitance modulation frequency of the variable capacitance circuit 13 is equal to the frequency of the driving signals S2. This means that the frequency of the current i generated due to the changes in the electrostatic capacitance C1 is equal to the frequency of the driving signal S1 and the frequency of the detection signal S3 generated by the preamp 16 is also equal to the frequency of the driving signal S1. Accordingly, in the present embodiment, the synchronous detection circuit 23 is constructed so as to generate a pulse signal S5 by detecting the detection signal 54 in synchronization with the driving signal S1. Here, the amplitude of the pulse signal S5 changes in proportion to the magnitude of the current i flowing through the variable capacitance circuit 13 and the polarity of the pulse signal S5 changes in accordance with the direction of the current i flowing through the variable capacitance circuit 13. The integrator 24 generates a DC voltage V3 by continuously integrating the pulse signal 55 and outputs the DC voltage V3 to the voltage generating circuit 25. In the present embodiment, as one example, the integrator 24 is set so as to output a DC voltage V3 of zero volts in a period until the first pulse signal S5 is inputted following the start of an integration operation. The amplification circuit 22, the synchronous detection circuit 23, and the integrator 24 construct a control unit CNT that controls the voltage generating circuit 25. Under control by the control unit CNT, the voltage generating circuit 25 generates a feedback voltage V4 and applies the feedback voltage V4 to the case 11 of the probe unit 2. More specifically, the voltage generating circuit 25 amplifies the inputted DC voltage V3 to generate the feedback voltage V4. By doing so, the voltage of the case 11 at the reference potential is kept equal to the feedback voltage V4. The voltmeter 26 measures the feedback voltage V4 relative to ground potential (the "basic potential") and displays the voltage.

Next, the method of measuring the voltage V1 of the measured object 4 using the voltage measuring apparatus 1 and a measuring operation of the voltage measuring apparatus 1 will be described. Note that for ease of understanding the present invention, an example where the voltage V1 is a constant positive voltage will be described, but when the voltage V1 is a constant negative voltage, measuring is carried out in the same way except that the polarities of the corresponding signals and voltages are inverted. Also, if the voltage V1 is an AC voltage, in principle measuring can be carried out in the same way as when the voltage V1 is a constant positive DC voltage or a constant negative DC voltage.

First, when measuring the voltage V1, the probe unit 2 is positioned near the measured object 4 so that the detection electrode 12 faces but does not contact the measured object 4. By doing so, as shown in FIG. 1, the electrostatic capacitance C0 is formed between the detection electrode 12 and the measured object 4. Here, the capacitance of the electrostatic capacitance C0 changes inversely proportionally to the distance between the detection electrode 12 and the measured object 4, but once the probe unit 2 has been positioned, the electrostatic capacitance C0 will become constant (i.e., will not vary) so long as environmental conditions such as humidity are constant. However, if environmental conditions such as humidity do change, the electrostatic capacitance C0 will vary.

Next, in the operating state of the voltage measuring apparatus 1, inside the main unit 3 the oscillation circuit 21 starts generating the driving signal S1 and outputs the driving signal S1 to the probe unit 2 and the synchronous detection circuit 23. In the probe unit 2, the driving circuit 14 converts the inputted driving signal S1 to the driving signals S2a, S2b that have inverted phases but the same amplitude and outputs the driving signals S2a, S2b to the capacitance circuits 13c, 13f of the variable capacitance circuit 13. Since the driving signals S2a, S2b that have the same amplitude are applied with the same timing to the capacitance circuits 13c, 13f, the respective electrostatic capacitances of the capacitance circuits 13c, 13f become equal and change with the same timing. Accordingly, the variable capacitance circuit 13 starts an operation that cyclically changes the electrostatic capacitance C1 (i.e., the total series capacitance of the electrostatic capacitances of the capacitance circuits 13c, 13f) with a capacitance modulation frequency (which is equal to the frequency of the driving signals S2) in synchronization with the cycle of the inputted driving signals S2. When doing so, since the driving signals S2a, S2b have inverted phases but the same amplitude, the electrostatic capacitance C1 of the variable capacitance circuit 13 cyclically changes in a state where voltage components due to the driving signals S2a, S2b are not generated across both ends of the variable capacitance circuit 13 (i.e., between the detection electrode 12 end and the case 11 end of the variable capacitance circuit 13). Here, as described above, since the variable capacitance circuit 13 is connected in series to the case 11 and the detection electrode 12 via the current detector 15, the electrostatic capacitance C1 of the variable capacitance circuit 13 and the electrostatic capacitance C0 formed between the measured object 4 and the detection electrode 12 become connected in series between the measured object 4 and the case 11, This means that by cyclically changing the electrostatic capacitance C1, an electrostatic capacitance C2 (i.e., the total series capacitance of the electrostatic capacitances C0, C1) between the measured object 4 and the case 11 is also cyclically changed.

Since the integrator 24 outputs the DC voltage V3 of zero volts immediately after the voltage measuring apparatus 1 starts operating, the voltage generating circuit 25 generates the feedback voltage V4 of a predetermined voltage (as one example, a voltage that is lower than the voltage V1 and is substantially zero volts) and applies the feedback voltage V4 to the case 11 of the probe unit 2. This means that a potential difference (V1-V4) is generated between the measured object 4 and the case 11. Accordingly, by cyclically changing the electrostatic capacitance C2 between the measured object 4 and the case 11 based on the cyclical changes in the electrostatic capacitance C1 as described above, a current i (of the capacitance modulation frequency) with an amplitude that corresponds to the potential difference (V1-V4) between the voltages V1, V4 of the measured object 4 and the case 11 is caused to flow through the variable capacitance circuit 13. Here, the amplitude (i.e., magnitudes of the current i increases when the potential difference (V1-V4) is large and decreases when the potential difference (V1-V4) is small. That is, although not shown, the current i flows as an AC signal whose cycle is the same as the cycle of the driving signals S2 and whose amplitude changes in accordance with the potential difference (V1-V4). The preamp 16 amplifies the voltage V2 generated across both ends of the current detector 15 due to the current i flowing and outputs the amplified voltage to the main unit 3 as the positive detection signal S3. As described above, since the driving signals S2a, S2b have inverted phases but the same amplitude, the voltage components due to the driving signals S2a, S2b generated by the capacitance circuits 13c, 13f cancel each other out. Accordingly, hardly any voltage components due to the driving signals S2a, S2b are generated across both ends of the variable capacitance circuit 13 (i.e., between the detection electrode 12 end and the case 11 end of the variable capacitance circuit 13). On the other hand, since the electrostatic capacitances of the capacitance circuits 13c, 13f, that is, the electrostatic capacitance C1 of the variable capacitance circuit 13, are changed by the driving signals S2a, S2b, the frequency of the changes in capacitance of the electrostatic capacitance C1 (i.e., the "capacitance modulation frequency") and the frequency of the current i generated due to such changes in capacitance match the frequency of the driving signals S2a, S2b. Accordingly, like the current i, the frequency of the detection signal S3 becomes equal to the frequency of the driving signals S2a, S2b.

Figure 2:
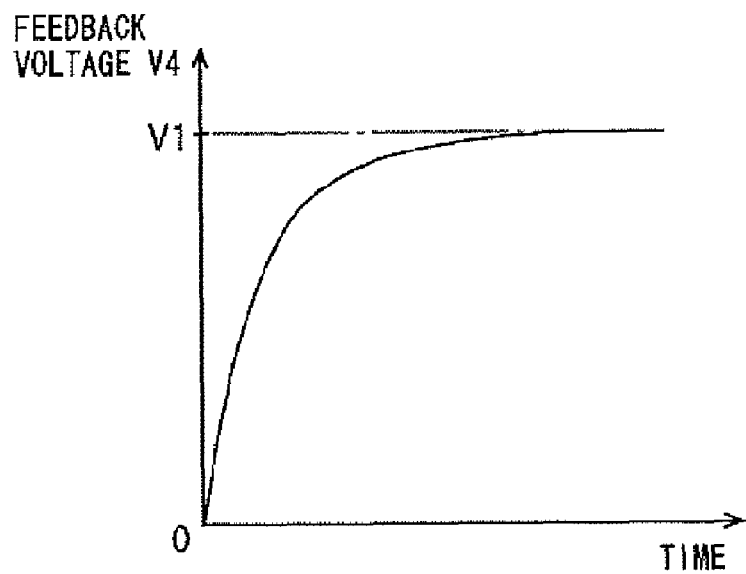
FIG. 2 is a characteristics graph showing changes over time in a feedback voltage.

In the control unit CNT of the main unit 3, the amplification circuit 22 amplifies the detection signal S3 to generate the detection signal S4 and outputs the detection signal S4 to the synchronous detection circuit 23. Next, the synchronous detection circuit 23 detects the inputted detection signal S4 in synchronization with the driving signal S3 to generate the pulse signal S5 and outputs the pulse signal S5 to the integrator 24. After this, the integrator 24 generates the DC voltage V3 by continuously integrating the pulse signal S5 and outputs the DC voltage V3 to the voltage generating circuit 25. Here, as described above, in the present embodiment, until the feedback voltage V4 reaches the voltage V1 after the voltage measuring apparatus 1 has started operating, the detection signal S3 will always be a positive signal and since the detection signal S4 also becomes a positive signal in the same way, the pulse signal S5 is always a positive pulse signal. As a result, the magnitude of the DC voltage V3 outputted from the integrator 24, or in other words, from the control unit CNT gradually increases. Accordingly, the magnitude of the feedback voltage V4 generated by the voltage generating circuit 25 also gradually increases as shown in FIG. 2. As a result, inside the feedback loop constructed of the current detector 15, the preamp 16, the amplification circuit 22, the synchronous detection circuit 23, the integrator 24, and the voltage generating circuit 25, there is negative feedback so that the potential difference (V1-V4) between the measured object 4 and the case 11 gradually decreases (falls). Accordingly, the magnitude of the current i gradually decreases (falls).

After this, when the feedback voltage V4 reaches the voltage V1, the potential difference (V1-V4) becomes zero volts. In this state, even if the electrostatic capacitance C2 between the measured object 4 and the case 11 cyclically changes, the current i will not flow. Since the current i does not flow, the current detector 15 does not generate the voltage V2 (i.e., the voltage V2 becomes zero) and the detection signal S3 is no longer outputted from the preamp 16. Since the detection signal S3 is not outputted, the detection signal S4 is also not outputted from the amplification circuit 22, the outputting of the pulse signal S5 from the synchronous detection circuit 23 is stopped, and as a result, the DC voltage V3 outputted from the integrator 24 stops increasing and is maintained at a constant voltage. This means that the feedback voltage V4 outputted from the voltage generating circuit 25 stops increasing and as shown in FIG. 2 is maintained at a constant voltage. Accordingly, the voltage (the feedback voltage V4) displayed by the voltmeter 26 is continuously observed, and when the voltage has stopped increasing and has become constant (that is, when the current i has become zero amps), the voltage (the feedback voltage V4) displayed by the voltmeter 26 at that time is measured as the voltage V1 of the measured object 4. By doing so, the measuring of the voltage V1 of the measured object 4 is completed. Note that by increasing the gain of the amplification circuit 22, the voltage generating circuit 25, and the like, it is possible to sufficiently increase the response speed of the feedback loop of the voltage measuring apparatus 1. In this case, since it is possible to make the feedback voltage V4 sufficiently track a voltage V1 that varies, it is possible to measure the voltage displayed by the voltmeter 26 as the voltage V1 of the measured object 4 without waiting for the displayed value to stabilize.

In this way, in the voltage measuring apparatus 1, in a state where the detection electrode 12 has been disposed facing the measured object 4 so that a constant (i.e., fixed) electrostatic capacitance C0 is formed between the measured object 4 and the detection electrode 12, the control unit CNT causes the voltage generating circuit 25 to change the feedback voltage V4 (i.e., the reference potential) while the electrostatic capacitance C1 of the variable capacitance circuit is cyclically changing. This means that by detecting the current i generated by (i.e., flowing through) the variable capacitance circuit 13 while the capacitance of the variable capacitance circuit 13 is cyclically changing, it is possible to measure the feedback voltage V4 when the current i has become zero amps or substantially zero amps as the voltage V1 of the measured object 4. In this way, according to the voltage measuring apparatus 1, since the voltage V1 of the measured object 4 can be measured in a state where the detection electrode 12 is disposed on the surface of the case 11 and the variable capacitance circuit 13 is disposed inside the case 11, it is not necessary to provide the case 11 with a hole or positioning the variable capacitance circuit 13 directly facing the measured object 4. As a result, it is possible to reliably avoid having foreign matter erroneously inserted into the case 11 via the hole and to avoid damage to components inside the case 11 due to such erroneous insertion, and therefore the reliability of the voltage measuring apparatus 1 can he sufficiently improved.

Also, according to the voltage measuring apparatus 1, the variable capacitance circuit 13 is constructed so that the capacitance circuits 13c, 13f constructed as described above are disposed in series between the detection electrode 12 and the case 11 so that respective directions of the diodes 13a, 13e become reverse to each other. The driving circuit 14 applies the driving signals S2a, S2b whose respective phases are inverted Lo the capacitance circuits 13c, 13f so that the voltage components of the driving signals S2a, S2b generated by the capacitance circuits 13c, 13f cancel each other out, thereby making it possible to avoid generating voltage components of the driving signals S2 between the detection electrode 12 end and the case 11 end of the variable capacitance circuit 13. Since it is possible to eradicate the influence of the driving signals S2 on the current i generated by the variable capacitance circuit 13 (or the influence of the voltage across both ends of the variable capacitance circuit 13) while the electrostatic capacitance is being changed, the current i (or the voltage across both ends of the variable capacitance circuit 13) can be detected by the preamp 16 more accurately. In this way, according to the voltage measuring apparatus 1, it is possible to detect the voltage V1 of the measured object 4 more accurately. Also, by using diodes as the first elements 13a, 13d, it is possible to easily and inexpensively construct the variable capacitance circuit 13.

According to the voltage measuring apparatus 1, by constructing the driving circuit 14 so as to include the two transformers 14a, 14b that are connected together as described above and the capacitance elements 14c, 14d, by merely applying the same driving signal S1 to the primary windings W1, W3 of the transformers 14a, 14b, it is possible to generate two driving signals S2a, S2b that have respectively inverted phases and to apply the driving signals S2a, S2b to the capacitance circuits 13c, 13f. Also, according to the DC circuit breaker function of the capacitance elements 14c, 14d, it is possible to reliably avoid having a DC current flow from the measured object 4 to the case 11 via the variable capacitance circuit 13. In addition, by using capacitors as the capacitance elements 14c, 14d, it is possible to construct the driving circuit 14 cheaply.

According to the voltage measuring apparatus 1, by having the control unit CNT cause the voltage generating circuit 25 to change the feedback voltage V4 so that the current i generated by the variable capacitance circuit 13 decreases, that is, by having the control unit CNT carry cut feedback control of the voltage generating circuit 25 based on the current i, the voltage V1 of the measured object 4 can be measured with high precision compared for example to a construction where the electrostatic capacitance of a variable capacitance circuit is statically changed to a known electrostatic capacitance, the voltage applied to the variable capacitance circuit is detected for each electrostatic capacitance, a number of equations that is equal to the number of unknowns including the voltage of the measured object and the electrostatic capacitance between the measured object and the detection electrode are produced, and the voltage V1 of the measured object 4 is found by calculating the unknowns from such equations.

In particular, according to the voltage measuring apparatus 1, by using the construction where the detection electrode 12 is employed, it is possible to construct the variable capacitance circuit 13 using variable-capacitance diodes (which cannot directly form electrostatic capacitance between themselves and the measured object 4) as variable capacitors. In the case, compared to a construction (i.e., the construction disclosed by Japanese Laid-Open Patent Publication No. H04-305171) that forms the variable capacitance circuit 13 using a detection electrode and a vibrating body and a construction (i.e., the construction disclosed by Japanese Laid-Open Patent Publication No. H07-244103) that forms the variable capacitance circuit 13 using 30 a conductive sector and a detection electrode (a separate electrode to the detection electrode 12), in the variable capacitance circuit 13 that uses variable-capacitance diodes, it is possible to change the electrostatic capacitance C1 in a shorter cycle (that is, at a higher frequency) most of the time. Accordingly, it is possible to increase the response speed of the feedback loop constructed of the current detector 15 to the voltage generating circuit 25 and as a result, it is possible to measure the voltage V1 of the measured object 4 in a short time and to correctly measure the voltage V1 even when the voltage V1 of the measured object 4 varies over time or when the voltage V1 of the measured object 4 is an AC voltage that changes cyclically.

According to the voltage measuring apparatus 1, by using a construction where the current detector 15 constructed of an impedance element is disposed in series with the variable capacitance circuit 13 between the detection electrode 12 and the case 11, and the control unit CNT causes the voltage generating circuit 25 to change the feedback voltage V4 (the voltage of the case 11) so that the voltage V2 generated when the current i flows through the current detector 15 decreases, it is possible to freely change the magnitude of the voltage V2 generated when the current i flows by changing the impedance of the impedance element. This means that the voltage V1 of the measured object 4 can be measured across a wide voltage range from a low voltage to a high voltage.

Figure 3:
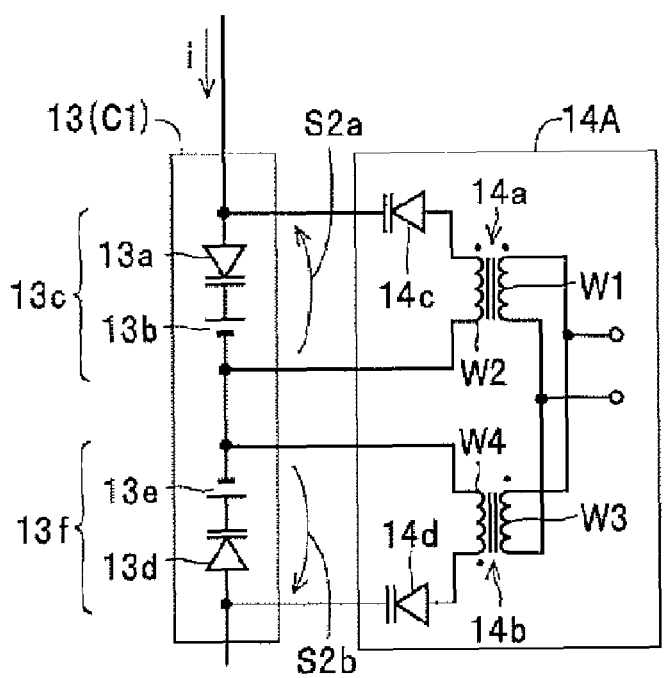
FIG. 3 is a block diagram showing another construction of a driving circuit.

Note that the present invention is not limited to the construction described above. For example, although capacitors are used in the voltage measuring apparatus 1 described above as the capacitance elements 14c, 14d in the driving circuit 14, like a driving circuit 14A shown in FIG. 3, it is possible to connect diodes, such as variable-capacitance diodes, with the polarities shown in FIG. 3 as the capacitance elements 14c, 14d. In the current loop constructed of the capacitance circuit 13c, the capacitance element 14c, and the secondary winding W2 of the transformer 14a, the polarities of the capacitance element 14c and the diode 13a of the capacitance circuit 13c are aligned so that a reverse bias is applied from the DC current supply 13b. This is also the same for the current loop composed of the capacitance circuit 13f and the like. Also, although the feedback voltage V4 is controlled by P (proportional) control in the voltage measuring apparatus 1 described above, by further adding at least one of an integral circuit and a differentiation circuit (neither is shown), it is also possible to control the feedback voltage V4 by one of PI (proportional-integral), PD (proportional-differential), or PID (proportional-integral-differential) control. Since it is possible to raise the ability to track the voltage V1 by using PID control, the voltage V1 of the measured object 4 can be measured with high precision when the voltage V1 changes.

Figure 4:
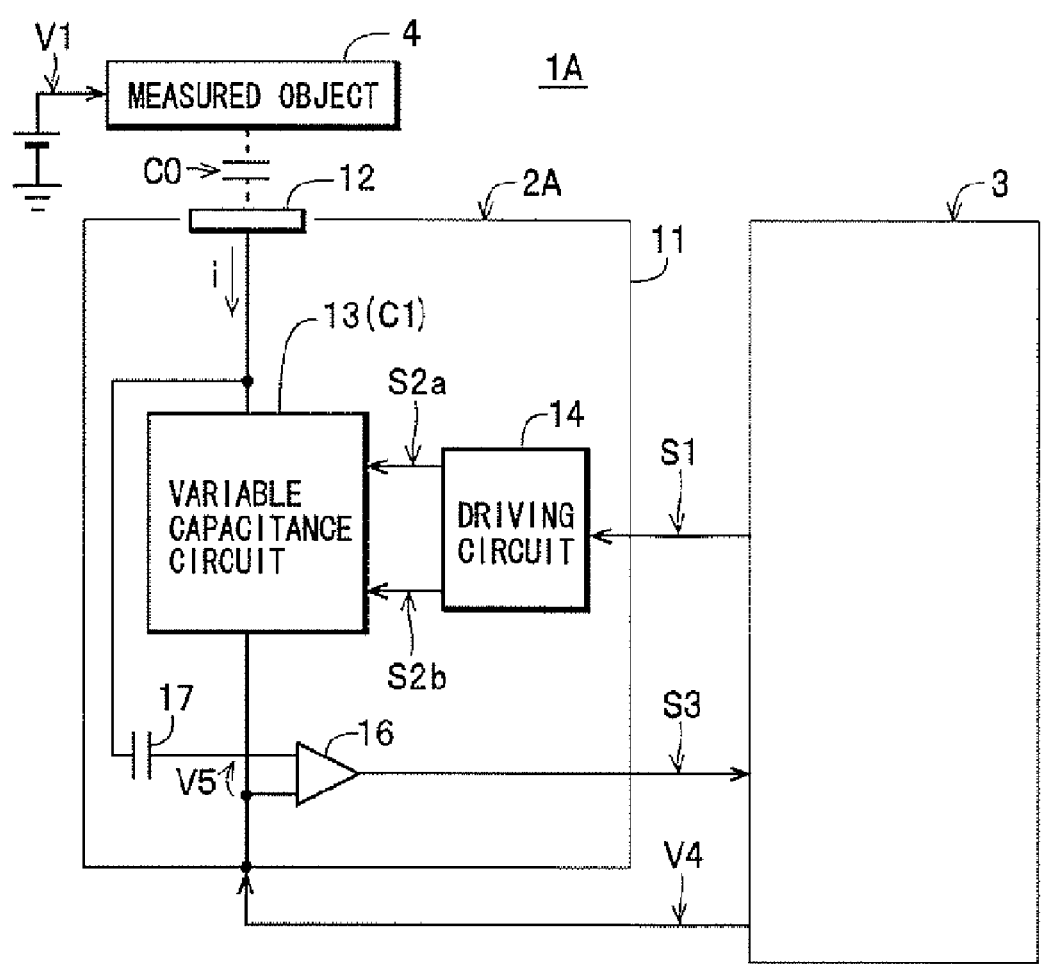
FIG. 4 is a block diagram of another voltage measuring apparatus.

Also, like the voltage measuring apparatus 1A shown in FIG. 4, it is possible to use a construction where the voltage V5 across both ends of the variable capacitance circuit 13 (i.e., the voltage generated between the detection electrode 12 end of the variable capacitance circuit 13 and the case 11 end of the variable capacitance circuit 13) is detected using the preamp 16 and outputted as the detection signal S3 and the control unit CONT controls the voltage generating circuit 25 based on the detection signal S3 that changes in proportion to the voltage V5 across the variable capacitance circuit 13 to measure the voltage V1 of the measured object 4. Here, as shown in FIG. 4, one input terminal out of the pair of input terminals of the preamp 16 is connected to the detection electrode 12 end of the variable capacitance circuit 13 via a capacitor 17 and the other input terminal is connected to the case 11 end of the variable capacitance circuit 13. Note that since the rest of the construction of the voltage measuring apparatus 1A is the same as the voltage measuring apparatus 1 described above, in FIG. 4 component elements that are the same as the component elements of the voltage measuring apparatus 1 have been assigned the same reference numerals and description thereof has been omitted. In the voltage measuring apparatus 1A, the potential difference (V1-V4) is divided by the electrostatic capacitance C0 and the electrostatic capacitance C1 of the variable capacitance circuit 13. Since the voltage V5 across the variable capacitance circuit 13 increases and decreases as the potential difference (V1-V4) increases and decreases, in the same way as the current i in the voltage measuring apparatus 1, the voltage V5 across both ends of the variable capacitance circuit 13 has a tendency to increase and decrease as the potential difference (V1-V4) increases and decreases. Accordingly, in the voltage measuring apparatus 13 also, by controlling the potential (the feedback voltage V4) of the case 11 based on the detection signal S3 that shows the change in the voltage V5 across both ends of the variable capacitance circuit 13, it is possible to measure the voltage V5 of the measured object 4 in the same way as with the voltage measuring apparatus 1. In addition, according to the voltage measuring apparatus 1A, compared to the voltage measuring apparatus 1, since it is possible to omit the current detector 15, the construction of the apparatus can be simplified, resulting in a fall in the apparatus cost.

Although the voltage measuring apparatuses 1, 1A use a synchronous detection method to detect the current i flowing through the variable capacitance circuit 13 or the voltage V5 across both ends of the variable capacitance circuit 13, the present invention is not limited to this and although not shown in the drawings, it is possible to use a well-known envelope detection method in place of synchronous detection.

Figure 5:
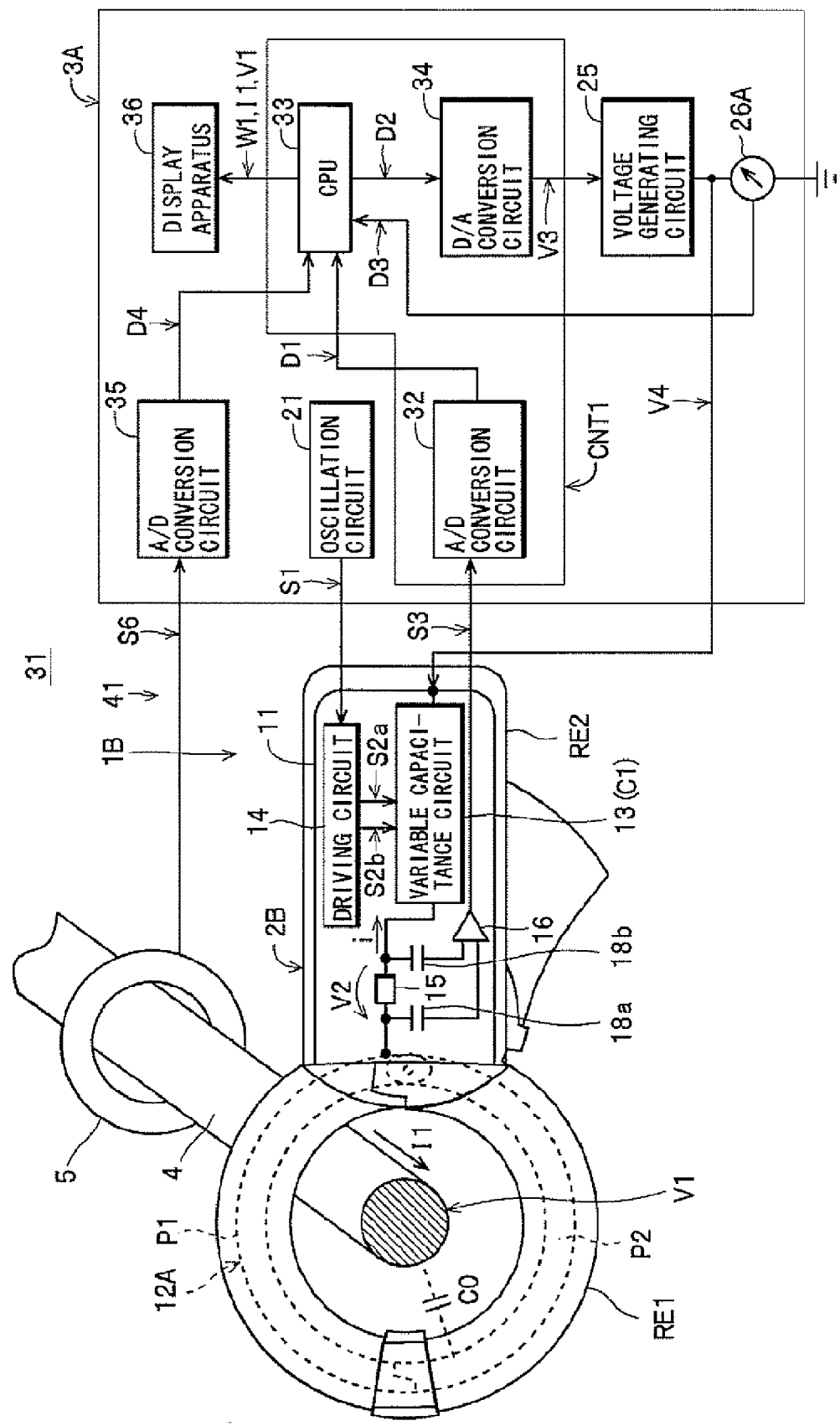
FIG. 5 is a block diagram of yet another voltage measuring apparatus and a power measuring apparatus that uses the same.

Although the current detector 15 is disposed between the variable capacitance circuit 13 and the case 11 in the voltage measuring apparatus 1, like the voltage measuring apparatus 1B shown in FIG. 5, it is also possible to dispose the current detector 15 between a detection electrode 12A and the variable capacitance circuit 13. Also, although the voltage generating circuit 25 is subjected to analog feedback control using the amplification circuit 22, the synchronous detection circuit 23, and the integrator 24 that operate using analog signals in the voltage measuring apparatus 1, like the voltage measuring apparatus 1B, the voltage generating circuit 25 may be subjected to digital feedback control by converting the detection signal S3 to digital data.

The voltage measuring apparatus 1B will now be described together with a power measuring apparatus 31 constructed using the voltage measuring apparatus 1B with reference to FIG. 5. Note that out of the component elements of the voltage measuring apparatus 1B, elements that are the same as the component elements of the voltage measuring apparatus 1 have been assigned the same reference numerals and description thereof has been omitted The power measuring apparatus 31 is constructed to measure DC and AC power and includes a clamp-type probe unit 2B for measuring voltage, a clamp-type probe unit 5 for measuring current, and a main unit 3A. In the power measuring apparatus 31, the voltage measuring apparatus 1B for measuring the voltage V1 of the measured object 4 (as one example, a wire and hereinafter also referred to as the "wire 4") is constructed of the probe unit 2B and component elements included in the main unit 3A that are described later. Also, a current measuring apparatus 41 for measuring a current I1 flowing through the wire 4 is constructed of the probe unit 5 and component elements included in the main unit 3A that are described later. The power measuring apparatus 31 measures the power W1 supplied to the wire 4 based on the voltage V1 measured by the voltage measuring apparatus 1B and the current I1 measured by the current measuring apparatus 41, The voltage measuring apparatus 1B includes the probe unit 2B, and the oscillation circuit 21, an A/D conversion circuit 32, a CPU 33, a D/A conversion circuit 34, a voltage generating circuit 25, and a voltmeter 26A disposed inside the main unit 3A. The probe unit 2B includes the case 11, the detection electrode 12A, the variable capacitance circuit 13, the driving circuit 14, the current detector 15, the preamp 16, and a pair of capacitors 18i a, 18b. The detection electrode 12A is constructed of a pair of arc-shaped electrodes P1, P2 that are entirely covered by an insulating film RE1 formed of a resin material or the like. One end of each o the arc-shaped electrodes P1, P2 is joined to the case 11 so that the arc-shaped electrodes P1, P2 are freely rotatable, and as a result, the other ends of the arc-shaped electrodes P1, P2 can be opened and closed. By using this construction, the detection electrode 12A can clamp the wire 4. The variable capacitance circuit 13, the driving circuit 14, the current detector 15, the preamp 16, and the pair of capacitors 18a, 18b are disposed inside the case 11 that is covered by an insulating film RE2 formed of a resin material or the like. Also, the variable capacitance circuit 13 and the current detector 15 are disposed between the detection electrode 12A and the case 11 in a state where the variable capacitance circuit 13 and the current detector 15 are connected in series. In the voltage measuring apparatus 1B, unlike the voltage measuring apparatus 1, the current detector 15 is connected to the detection electrode 12 and the variable capacitance circuit 13 is connected to the case 11. To avoid having the detection electrode 12A connected in a DC circuit to the reference potential via the preamp 16 due to the current detector 15 being disposed on the detection electrode 12 side, the capacitors 18a, 18b used as a DC circuit breaker are disposed between the input terminals of the preamp 16 that detects the voltage V2 and the ends of the current detector 15. Note that in the same way as with the voltage measuring apparatus 1, it is also possible to connect the variable capacitance circuit 13 and the current detector 15 in the mentioned order in series between the detection electrode 12A and the case 11 and with this construction, it becomes unnecessary to dispose the capacitors 18a, 18b between the input terminals of the preamp 16 and the ends of the current detector 15.

Together with the CPU 33 and the D/A conversion circuit 34, the A/D conversion circuit 32 disposed inside the main unit 3A constructs a control unit CNT1 for the present invention, and converts the detection signal S3 as an analog signal to digital data D1 and outputs the digital data D1 to the CPU 33. The CPU 33 carries out a detection process that extracts, from the inputted digital data D1, data for signals of the same frequency as the frequency of the driving signal S1, for example, and carries out an integration process that integrates the data detected by this detection process. The CPU 33 outputs the integrated data D2 obtained by the integration process to the D/A conversion circuit 34. As described later, the CPU 33 also functions as part of the current measuring apparatus 41 and based on digital data D4 outputted from an A/D conversion circuit 35 carries out a current calculating process that calculates (measures) the current I1 flowing through the measured object 4. In addition, based on the calculated value of the current I1 and the value (shown by digital data D3) of the feedback voltage V4 outputted from the voltmeter 26A, the CPU 33 carries out a power calculating process that calculates (measures) the power W1 supplied to the wire 4. The D/A conversion circuit 34 converts the integrated data D2 to the DC voltage V3 as an analog signal and outputs the DC voltage V3 to the voltage generating circuit 25. The voltmeter 26A measures and displays the feedback voltage V4 and converts the measured value of the feedback voltage V4 to the digital data D3 and outputs the digital data D3 to the CPU 33.

As shown in FIG. 5, the current measuring apparatus 41 includes the probe unit 5, and the A/D conversion circuit 35, the CPU 33, and a display apparatus 36 disposed inside the main unit 3A. Here, the probe unit 5 detects the value of the current I1 flowing through the clamped wire 4 without contacting the wire and outputs a detection signal S6 whose amplitude changes in accordance with the detected value to the A/D conversion circuit 35. The A/D conversion circuit 35 converts the inputted detection signal S6 to the digital data D4 and outputs the digital data D4 to the CPU 33. By carrying out the current calculating process described above, the CPU 33 calculates the value of the current I1 based on the digital data D4 and has the value displayed by the display apparatus 36.

In the voltage measuring apparatus 1B of the power measuring apparatus 31 constructed in this way, the A/D conversion circuit 32, the CPU 33, and the D/A conversion circuit 34 that construct the control unit CNT1 convert the detection signal S3 to the digital data D1 and carry out digital feedback control of the voltage generating circuit 25 based on the digital data D1. Aside from this, the A/D conversion circuit 32, the CPU 33, and the D/A conversion circuit 34 that construct the control unit CNT1 carries out feedback control of the voltage generating circuit 25 in the same way as the various component elements of the control unit CNT of the voltage measuring apparatus 1 to make the voltage V4 match the feedback voltage V1.

On the other hand, in the current measuring apparatus 41, the A/D conversion circuit 35 converts the detection signal S6 detected by the probe unit 5 to the digital data D4 and outputs the digital data D4 to the CPU 33 which then calculates the value of the current I1 flowing through the wire 4 by carrying out the current calculating process based on the digital data D4.

The CPU 33 also carries out the power calculating process based on the value of the feedback voltage V4 shown by the digital data D3 inputted from the voltmeter 26 (that is, the value of the voltage V1) and the value of the current I1 calculated by the current calculating process to calculate (measure) the power W1 supplied to the wire 4 and has the display apparatus 36 display the calculated value. By doing so, measurement of the power W1 is completed. Here, the CPU 33 has the display apparatus 36 display the value of the voltage V1 together with the power W1 and the value of the current I1. Note that instead of having the display apparatus 36 display the current and voltage values, it is possible to use a construction where the current and voltage values are stored in a storage apparatus (not shown) and/or transferred to the periphery via a data transfer apparatus (not shown).

In this way, in the voltage measuring apparatus 1B, when measuring the voltage V1 of the wire 4 as the measured object 4, the detection signal S3 that shows the current i flowing through the variable capacitance circuit 13 is converted to the digital data D1 and digital feedback control is carried out over the voltage generating circuit 25 based on the digital data D1. Accordingly, the control unit CNT1 (the A/D conversion circuit 32, the CPU 33, and the D/A conversion circuit 34) can be easily constructed using a CPU or a DSP. In the voltage measuring apparatus 1B, the detection electrode 12A is constructed of a pair of arc-shaped electrodes P1, P2 that are entirely covered by the insulating film RE1 and the variable capacitance circuit 13, the driving circuit 14r the current detector 15, the preamp 16, and the pair of capacitors 18a, 18b are disposed inside the case 11 that is covered by the insulating film RE2. Since the detection electrode 12A, the variable capacitance circuit 13, the driving circuit 14, the current detector 15, the preamp 16, and the pair of capacitors 18a, 18b are not exposed to the periphery, it is possible to reliably avoid contact between such circuits and components and foreign matter outside the apparatus. Accordingly, it is possible to sufficiently improve the reliability of the voltage measuring apparatus 1B. By doing so, it is also possible to sufficiently improve the reliability of the power measuring apparatus 31 that uses the voltage measuring apparatus 1B.

Figure 6:
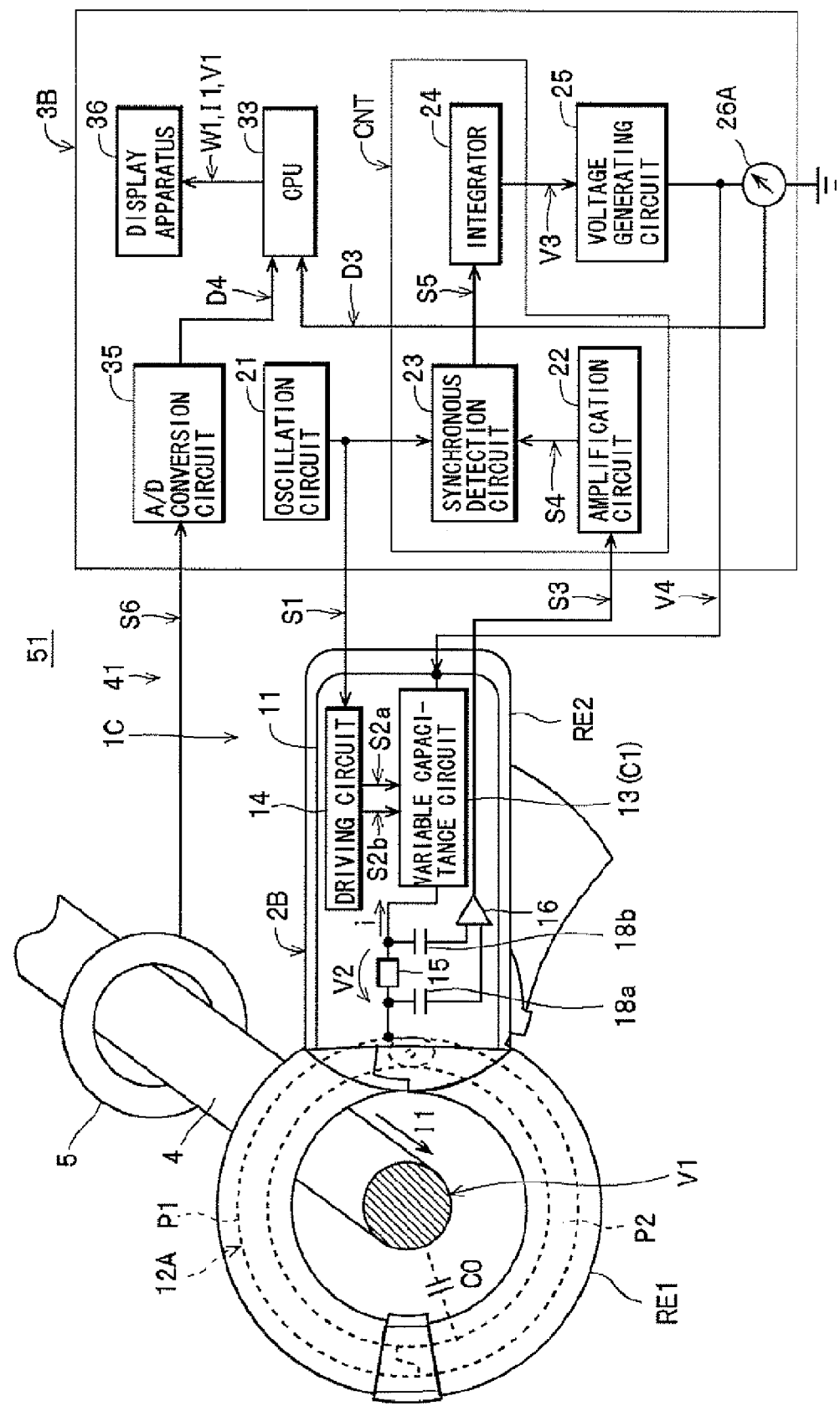
FIG. 6 is a block diagram of yet another voltage measuring apparatus and a power measuring apparatus that uses the same.

Also, although the power measuring apparatus 31 that uses a voltage measuring apparatus 1B for carrying out digital feedback control has been described, as shown in FIG. 6, it is possible to construct a power measuring apparatus 51 using a voltage measuring apparatus 1C that carries out analog feedback control. This power measuring apparatus 51 will now he described. Note that component elements that are the same as the voltage measuring apparatus 1 and component elements that are the same as the power measuring apparatus 31 have been assigned the same reference numerals and description thereof has been omitted The power measuring apparatus 51 is constructed so as to be capable of measuring DC and AC power and, as shown in FIG. 6, includes the probe units 2B, 5 and a main unit 3B. Here, in the power measuring apparatus 51, the voltage measuring apparatus 1C that measures the voltage V1 of the measured object 4 (as one example, the wire 4) is constructed of the probe unit 2B and the component elements described later that are included in the main unit 3B. In the same way, the current measuring apparatus 41 that measures the current I1 flowing through the wire 4 is constructed of the probe unit 5 and the component elements described later that are included in the main unit 3B. The power measuring apparatus 51 measures the power W1 supplied to the wire 4 based on the value of the voltage V1 measured by the voltage measuring apparatus 1C and the value of the current I1 measured by the current measuring apparatus 41.

The voltage measuring apparatus 1C includes the probe unit 2B and the oscillation circuit 21, the control unit CNT, the voltage generating circuit 25, and the voltmeter 26A disposed inside the main unit 3B. Here, the control unit CNT generates the DC voltage V3 based on the detection signal S3 as an analog signal and outputs the DC voltage V5 to the voltage generating circuit 25 so as to carry out analog feedback control over the feedback voltage V4 so as to make the feedback voltage V4 match the voltage V1. The current measuring apparatus 41 includes the probe unit 5 and the A/D conversion circuit 35 the CPU 33, and the display apparatus 36 disposed inside the main unit 3B. Here, the CPU 33 3C carries out a current calculating process to calculate the value of the current I1 based on the digital data D4 inputted from the A/D conversion circuit 35 and has the display apparatus 36 display the calculated value. The CPU 33 also calculates the value of the feedback voltage V4 (i.e., the voltage V1) based on the digital data D3 inputted from the voltmeter 26A and has the display apparatus 36 display the calculated value. In addition, the CPU 33 calculates (measures) the power W1 supplied to the wire 4 by carrying cut a power calculating process based on the value of the feedback voltage V4 (that is, the value of the voltage V1) shown by the digital data D3 inputted from the voltmeter 26A and the value of the current I1 calculated by the current calculating process, and has the display apparatus 36 display the calculated value.

In the power measuring apparatus 51 also, by sufficiently improving the reliability of the voltage measuring apparatus 1C in the same way as the voltage measuring apparatus 1B, it is possible to sufficiently improve the reliability of the power measuring apparatus 51 that uses the voltage measuring apparatus 1C.

Figure 7:
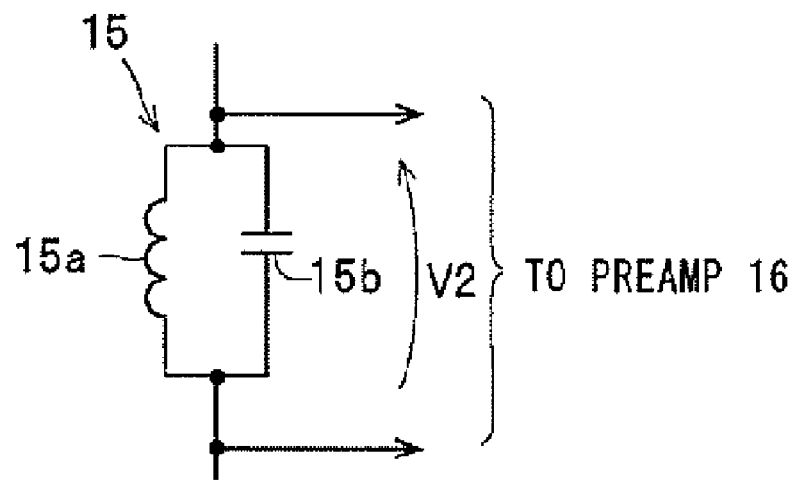
FIG. 7 is a circuit diagram showing an example construction of a current detector.
Figure 8:
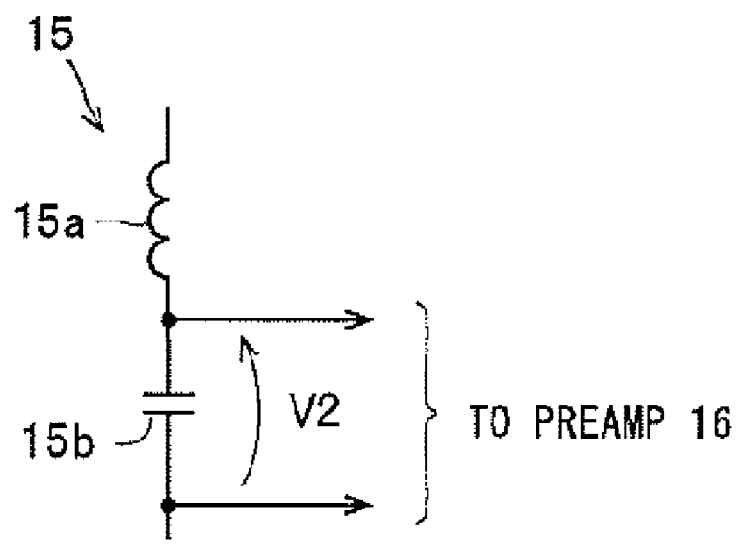
FIG. 8 is a circuit diagram showing another example construction of the current detector.

In the voltage measuring apparatuses 1, 1B, and 1C described above, the current detector 15 is constructed using a resistor, but the impedance element is not limited to a resister and it is possible to use a capacitor or a coil, or a combination of the same. By using this type of impedance element, by changing the impedance of the impedance element, it is possible to freely change the voltage V2 generated when the current i flows. This means that it is possible to set the voltage V2 generated across the current detector 15 at an appropriate value in accordance with the magnitude of the voltage of the measured object 4 so that the voltage of the measured object 4 can be correctly measured across a wide voltage range from a low voltage to a high voltage. Also, in place of the impedance element, it is also possible to use a resonance circuit, which includes any of a variety of resonators such as a ceramic resonator or a crystal resonator, or an LC resonance circuit (a serial resonance circuit or a parallel resonance circuit) constructed of a coil and a capacitor. Out of such resonance circuits, an LC parallel resonance circuit and a resonance circuit that includes a resonator have a property whereby impedance is maximized at a specified frequency (the resonance frequency). This means that as shown in FIG. 7 for example, by constructing the current detector 15 using an LC parallel resonance circuit constructed of a coil 15a and a capacitor 15b and setting the specified frequency so as to match the capacitance modulation frequency of the variable capacitance circuit 13, even if noise of a different frequency to the capacitance modulation frequency is superimposed on the current in it will be possible to sufficiently increase, relative to a voltage component due to the noise, the voltage component due to the current i out of the voltage components included in the voltage V2 generated across the ends of the current detector 15, thereby suppressing the noise. On the other hand, an LC series resonance circuit has a property whereby the overall impedance is minimized (i.e., becomes zero) at a specified frequency (the resonance frequency). At such timer the voltage across the ends of the capacitor (and also the coil) that constructs the LC series resonance circuit is maximized. This means that as shown in FIG. 8 for example, by constructing the current detector 15 using an LC series resonance circuit constructed of a coil 15a and a capacitor 15b, setting the specified frequency so as to match the capacitance modulation frequency of the variable capacitance circuit 13, and using a construction where the preamp 16 detects the voltage across the ends of the capacitor 15b (or the coil 15a) as the voltage V2, even if noise of a different frequency to the capacitance modulation frequency is superimposed on the current i, it will be possible to suppress the generation of voltage due to noise in the voltage generated across the ends of the current detector 15 in the sane way as with the LC parallel resonance circuit described above. Accordingly, by constructing the current detector 15 of such types of resonance circuit and changing the impedance when the resonance circuit resonates, it is possible to freely change the voltage generated across the resonance circuit when the current i flows so that the voltage V1 of the measured object 4 can be measured across a wide voltage range from a low voltage to a high voltage. Also, since it is possible to detect the current i flowing in the resonance circuit as a larger voltage by changing the electrostatic capacitance C1 of the variable capacitance circuit 13 at the resonance frequency of the resonance circuit, it is possible to reduce the mixing of a voltage signal caused by such noise into the detection signal S3, and as a result, the voltage measuring apparatuses 1, 1B, and 1C can be made more resistant to noise. Accordingly, it is possible to measure the voltage V1 of the measured object 4 with reduced error. Also, in place of a construction that detects the current by converting the current to a voltage using an impedance element, such as a resistor, or a resonance circuit, it is possible to use a construction that directly detects the current. As such construction, it is possible to use a current detector that uses electromagnetic induction (a CT current detector), or to use a magnetic sensor such as a Hall element, a magnetic bridge, a flux gate sensor, an MI (magnetic impedance) sensor, an MR magnetoresistive effect) sensor, a GMR (giant agnetoresistive effect) sensor, or a TMR (tunneling agnetoresistive effect) sensor.

Also, although examples where the detection signal S3 generated by the preamp 16 is directly inputted into the amplification circuit 22 or the A/D conversion circuit 32 have been described as the voltage measuring apparatuses 1, 1A, 1B, and 1C, it is also possible to input the detection signal S3 via a filter circuit (not shown) directly into the amplification circuit 22 or the A/D conversion circuit 32. When doing so, by constructing the filter circuit so as to selectively pass signals of the same frequency as the capacitance modulator frequency of the variable capacitance circuit 13, even if noise of a different frequency to the capacitance modulation frequency is superimposed on the current i, it will be possible to suppress the mixing of noise into the detection signal S3. As a result, the voltage measuring apparatuses 1, 1A, 13, and 1C can be made more resistant to noise.

Although examples where the voltage measuring apparatuses 1, 1A, 1B, and 1C are used in the power measuring apparatus 31 have been described, the voltage measuring apparatuses 1, 1A, 1B, and 1C can be used as a surface potentiometer that detects the surface potential of a photosensitive drum in a copier such as a laser printer. It is also possible to use the voltage measuring apparatuses 1, 1A, 1B, and 1C as a detector that detects the position of electric wiring installed inside a wall. By using the voltage measuring apparatus according to the present invention in such appliances, it is possible to sufficiently improve the reliability (including the durability and weather resistance) of such appliances. The present invention can also be applied to a testing apparatus that detects broken wires and the like in a printed pattern formed on a printed circuit board.

Also, although the voltage measuring apparatuses 1, 1A, 1B, and 1C measure the voltage V1 with high precision by using a construction where the feedback voltage V4 is measured as the voltage V1 of the measured object 4 at a point when the feedback voltage V4 has reached the voltage V1, that is, a point where the current i has become zero amps or when the voltage V5 across the ends of the variable capacitance circuit 13 has become zero volts, so long as the measurement precision is tolerated, it is also possible to use a construction where the feedback voltage V4 is measured as the voltage V1 of the measured object 4 at a point where the current i or the voltage V5 across the ends of the variable capacitance circuit 13 is at or below a predetermined value (for example, several milliamps or several millivolts). It is also possible to use a construction where the feedback voltage V4 is measured as the voltage V1 of the measured object 4 when the potential difference (V1-V4) has reached or is below a predetermined value (for example, several hundred millivolts). By using this construction, it is possible to measure the voltage V1 of the measured object 4 with tolerable precision in a shorter time.

What is claimed is:

1. A voltage measuring apparatus that measures a voltage of a measured object, comprising:
    a detection electrode capable of being disposed facing the measured object;
    a variable capacitance circuit that is connected between the detection electrode and a reference potential and whose electrostatic capacitance can be changed;
    a voltage generating circuit that generates the reference potential; and
    a control unit, wherein the control unit causes the voltage generating circuit to change a voltage of the reference potential while the electrostatic capacitance of the variable capacitance circuit is being changed, wherein the variable capacitance circuit includes first and second capacitance circuits that are each constructed by connecting a first element, which has a P-type semiconductor and an N-type semiconductor that are joined together, and a DC power supply, which applies a reverse bias to the first element, in series, the first and second capacitance circuits being disposed in series between the detection electrode and the reference potential so that respective directions of the first elements become reverse to each other, and
    a driving circuit that drives the variable capacitance circuit by applying driving signals with inverted phases to the first and second capacitance circuits, respectively.

2. A voltage measuring apparatus according to claim 1, wherein each of the first elements is constructed of a diode formed of the P-type semiconductor and the N-type semiconductor.

3. A voltage measuring apparatus according to claim 1, wherein the driving circuit includes first and second transformers whose primary windings are connected in parallel, a first capacitance element connected in series to a secondary winding of the first transformer, and a second capacitance element connected in series to a secondary winding of the second transformer, a series circuit composed of the secondary winding of the first transformer and the first capacitance element is connected in parallel to the first capacitance circuit, and a series circuit composed of the secondary winding of the second transformer and the second capacitance element is connected in parallel to the second capacitance circuit.

4. A voltage measuring apparatus according to claim 3, wherein the first capacitance element and the second capacitance element are constructed of capacitors.

5. A power measuring apparatus, comprising:

a current measuring apparatus that measures current flowing in a measured object; and a voltage measuring apparatus according to claim 1 that measures a voltage of the measured object, wherein the power measuring apparatus measures power based on the current measured by the current measuring apparatus and the voltage measured by the voltage measuring apparatus.

6. A voltage measuring apparatus that measures a voltage of a measured object, comprising:

a detection electrode capable of being disposed facing the measured object;

a variable capacitance circuit that is connected between the detection electrode and a reference potential and whose electrostatic capacitance can be changed;

a voltage generating circuit that generates the reference potential; and a control unit, wherein the control unit causes the voltage generating circuit to change a voltage of the reference potential while the electrostatic capacitance of the variable capacitance circuit is being changed, wherein while the electrostatic capacitance is being changed, the control unit causes the voltage generating circuit to change the voltage of the reference potential so that one of a current flowing between the detection electrode and the reference potential via the variable capacitance circuit and a voltage generated between a detection electrode end and a reference potential end of the variable capacitance circuit falls.

7. A voltage measuring apparatus according to claim 6, further comprising an impedance element disposed in series with the variable capacitance circuit between the detection electrode and the reference potential, wherein the control unit causes the voltage generating circuit to change the voltage of the reference potential so that the voltage generated across the impedance element when the current flows through the impedance element falls.

8. A voltage measuring apparatus according to claim 6, further comprising a resonance circuit disposed in series with the variable capacitance circuit between the detection electrode and the reference potential, wherein the control unit causes the voltage generating circuit to change the voltage of the reference potential so that the voltage generated across the resonance circuit when the current flows through the resonance circuit falls.

9. A voltage measuring apparatus according to claim 6, wherein the control unit includes an A/D conversion circuit that receives an input of a detection signal whose voltage changes in accordance with a value of the current or a value of the voltage generated between the detection electrode end and the reference potential end and converts the detection signal to digital data, and the control unit causes the voltage generating circuit to change the voltage of the reference potential based on the digital data so that the voltage of the detection signal falls.

10. A power measuring apparatus, comprising:

a current measuring apparatus that measures current flowing in a measured object; and a voltage measuring apparatus according to claim 6 that measures a voltage of the measured object, wherein the power measuring apparatus measures power based on the current measured by the current measuring apparatus and the voltage measured by the voltage measuring apparatus.

* * * * *